United States Patent
Zillman et al.

(10) Patent No.: US 10,659,027 B2
(45) Date of Patent: May 19, 2020

(54) COMPARATOR CIRCUITRY

(71) Applicant: SOCIONEXT INC., Yokohama-shi, Kanagawa (JP)

(72) Inventors: Uwe Zillman, Braunschweig (DE); Guido Dröge, Braunschweig (DE)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/243,987

(22) Filed: Jan. 9, 2019

(65) Prior Publication Data

US 2019/0229716 A1 Jul. 25, 2019

(30) Foreign Application Priority Data

Jan. 19, 2018 (EP) ..................................... 18152592

(51) Int. Cl.
| | | |
|---|---|---|
| *H03K 5/24* | (2006.01) | |
| *H03M 1/46* | (2006.01) | |
| *H03M 1/12* | (2006.01) | |
| *H03F 3/45* | (2006.01) | |
| *H03M 1/10* | (2006.01) | |

(52) U.S. Cl.
CPC ....... *H03K 5/2481* (2013.01); *H03F 3/45188* (2013.01); *H03M 1/1061* (2013.01); *H03M 1/1225* (2013.01); *H03M 1/462* (2013.01); *H03F 2203/45466* (2013.01); *H03F 2203/45726* (2013.01)

(58) Field of Classification Search
CPC .................................................. H03K 5/2481
USPC ...................... 327/50–52, 54–57, 63, 65, 67; 341/155–170
See application file for complete search history.

(56) References Cited

U.S. PATENT DOCUMENTS

| | | |
|---|---|---|
| 5,189,322 A | 2/1993 | Chan et al. |
| 7,154,421 B2 | 12/2006 | Devendorf et al. |
| 8,824,763 B2 | 1/2014 | Zhang |
| 9,124,266 B1 | 9/2015 | Rosen |

(Continued)

FOREIGN PATENT DOCUMENTS

EP 2 211 468 A1 7/2018

OTHER PUBLICATIONS

Extended European Search Report of related European Patent Application No. 18152592.4, dated May 25, 2018.

(Continued)

*Primary Examiner* — Tomi Skibinski
(74) *Attorney, Agent, or Firm* — Arent Fox LLP

(57) ABSTRACT

In circuitry to capture differences between magnitudes of first and second comparator input signals in capture operations defined by a clock signal, first and second nodes are connectable to a tail node receiving a cock-signal-independent bias current along first and second paths. During each capture operation, switching circuitry controls connections between the tall node and the first and second nodes based on the input signals to divide the bias current between the first and second paths depending on the input signal magnitude difference. The switching circuitry comprises first and second transistors arranged such that conductivity of connections between the tail node and the first and second nodes Is controlled by the magnitudes of the input signals, and third and fourth non-clocked transistors controlled by a clock-signal independent gate bias signal.

12 Claims, 11 Drawing Sheets

(56) References Cited

U.S. PATENT DOCUMENTS

| | | | |
|---|---|---|---|
| 2003/0122593 A1* | 7/2003 | Volk | H04L 25/0274 |
| | | | 327/108 |
| 2007/0132628 A1* | 6/2007 | Chen | H03M 1/002 |
| | | | 341/155 |
| 2008/0191770 A1* | 8/2008 | Nedovic | H03K 3/356139 |
| | | | 327/212 |
| 2012/0098572 A1* | 4/2012 | Tripathi | H03K 3/356182 |
| | | | 327/65 |
| 2013/0135126 A1 | 5/2013 | Cho et al. | |
| 2017/0264310 A1 | 9/2017 | Dedic et al. | |

OTHER PUBLICATIONS

Examination Report issued by the European Patent Office corresponding to European Patent Application No. 18152592.4, dated Mar. 30, 2020.

* cited by examiner

Related Art

COMPARATOR CIRCUITRY

CROSS-REFERENCE TO RELATED APPLICATION

This application claims priority from European Patent Application No. 18152592.4 filed Jan. 19, 2018. The entire contents of the prior application are incorporated herein by reference.

BACKGROUND OF THE TECHNOLOGY

Field

The present invention relates to comparator circuitry useful for capturing a difference between two input signals, for example a difference between their magnitudes. Such magnitudes may be voltage levels in the case of input voltage signals for example. Such circuitry may be useful in comparators.

Comparators typically compare two voltages or currents and output a signal indicating which one of the two is the larger (or the smaller). Comparators, in particular clocked comparators, are typically used in ADC (analogue-to-digital converter) and memory circuitry.

For example, a successive approximation register (SAR) ADC typically uses a comparator in each of its sub-conversion operations. Successive-approximation conversion may be considered as one example of a conversion process which is made up of a sequence of sub-conversion operations. Such ADC circuitry (mixed-signal circuitry) may have particular use, for example, as the ADC circuitry (sub-ADC units) used at the ends of the paths in the sampling circuitry disclosed in EP-A1-2211468.

It will be appreciated that the application of comparators (and circuitry thereof) in such ADC circuitry is merely one example application, and that the circuitry disclosed herein may be applied in comparators in general or indeed in circuitry for capturing or measuring or amplifying a magnitude difference between two input signals in general.

As background, therefore, to explore one potential application of circuitry of the present invention in ADC circuitry, aspects of the sampling circuitry disclosed in EP-A1-2211468 will now be considered.

Background

FIG. 1 is a schematic diagram of analogue-to-digital circuitry 40, to which the invention may be applied. Circuitry 40 comprises sampler 42, voltage-controlled oscillator (VCO) 44 as an example clock-signal generator, demultiplexers 46, ADC banks 48, digital unit 50 and calibration unit 52.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 it connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 156. As shown in FIG. 2, capacitance 150 may be variable in value, such that its value can be trimmed during calibration or during an initial setup phase. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area ($Q=\int I\,dt$), and because the voltage across the capacitance 150 is defined by that amount of charge Q and the capacitance value C ($V=Q/C$).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

FIG. 3 is a schematic diagram useful for understanding a possible application of SAR-ADC (Successive Approximation Register-Analogue-to-Digital Conversion) circuitry within each sub-ADC unit of the circuitry 48 in FIG. 1. Such circuitry could have a cycle of sub-conversion operations (phases/steps) of the form: Reset (R); Sample (S); 1; 2; 3; 4; 5; 6; 7 and 8, as shown in FIG. 3. In each Sample sub-version operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

FIG. 4 presents example SAR ADC circuitry which may be employed with the circuitry of FIGS. 1 and 2, i.e. as part of the sub-ADC units of the ADC banks 48. The main elements are a S/H circuit 170 to acquire $V_{OUT}$ from FIG. 2, a voltage comparator 180, an internal DAC 190 and an SAR 200. The comparator 180 compares the held $V_{OUT}$ with the output of the internal DAC 190 and outputs the result of the comparison to the SAR 200. The SAR 200 is designed to supply a digital code approximating $V_{OUT}$ to the internal DAC 190. The DAC 190 supplies the comparator with an analogue voltage based upon the digital code input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage $V_{OUT}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation. This places pressure on the comparator to consistently produce an accurate output within a given time period, even when its inputs may be very close in voltage level. The performance of the comparator affects the overall performance of the sub-ADC units and thus also of the overall analogue-to-digital circuitry 40 of FIG. 1.

Of course, the sub-conversion operations may instead be carried out asynchronously, i.e., with each individual successive sub-conversion operating being triggered by the preceding sub-conversion operation concluding. In that case the sub-conversion operations could be considered to be controlled by an asynchronous clock signal, but there may be pressure on the overall sequence of sub-conversion operations 1 to 8 completing with a given compare period which itself is synchronous with a synchronous clock signal.

It is desirable to provide circuitry which enables fast low-power low-noise comparator circuitry to be implemented. It is desirable for such circuitry to have consistent performance (e.g. over varying process, voltage, etc.). Such circuitry may be for use in a comparator, or may be for use in other types of circuitry (for example in memories).

SUMMARY

According to an embodiment of a first aspect of the present invention there is provided comparator circuitry for use in a comparator to capture differences between magnitudes of first and second comparator input signals in a series of capture operations defined by a clock signal, the circuitry comprising: a biasing current source configured to provide a bias current which flows independently of the clock signal; a tail node connected to receive the bias current; first and second nodes conductively connectable to said tail node along respective first and second paths; and switching circuitry configured during each capture operation to control connections between the tail node and the first and second nodes based on the first and second comparator input signals such that said bias current is divided between said first and second paths in dependence upon the difference between magnitudes of the first and second comparator input signals, wherein: the switching circuitry comprises a first transistor whose channel forms part of the first path and a second transistor whose channel forms part of the second path; gate or base terminals of the first and second transistors are controlled by the first and second comparator input signals, respectively, such that the conductivity of the connections between the tail node and the first and second nodes is controlled by the magnitudes of the first and second comparator input signals; the switching circuitry further comprises a third transistor whose channel forms part of the first path and a fourth transistor whose channel forms part of the second path; the third and fourth transistors are located along their respective paths between the first and second transistors and the first and second nodes, respectively; and the third and fourth transistors are non-clocked transistors whose gate or base terminals are controlled by a gate or base bias signal which is also independent of the clock signal.

By effectively shielding the first and second transistors (and thus also the first and second comparator input signals) from clocked circuitry, noise performance is improved as explained in more detail later herein. In particular, the biasing current source is configured to provide the bias current which flows independently of the clock signal, and the third and fourth transistors are controlled by a gate or base bias signal which is also independent of the clock signal. The bias current may be a non-clocked, constant or DC bias current. Each gate or base bias signal may be a non-clocked, constant or DC bias signal.

The first and second transistors may be located along their respective paths between the third and fourth transistors, respectively, and the tail node. The first and second transistors may be connected along their respective paths directly between the third and fourth transistors, respectively, and the tail node. Preferably, there is no clocked circuitry along the first and second paths between the third and fourth transistors and the tail node, and no clocked circuitry between the tail node and the biasing current source. Any circuitry along the first and second paths between the third and fourth transistors and the tail node, or between the tail node and the biasing current source, is preferably non-clocked circuitry.

The gate or base bias signals are configured to cause the third and fourth transistors to function as cascode transistors.

The switching circuitry may comprise a clocked switch operable based on the clock signal to connect the first and second nodes to a reference voltage supply (e.g. ground)

between capture operations so as to bring a voltage level at those nodes to a pre-capture state.

The clocked switch may comprise a fifth transistor whose channel forms part of the first path and a sixth transistor whose channel forms part of the second path, wherein the fifth transistor is connected between the first node and the reference voltage supply and the sixth transistor is connected between the second node and the reference voltage supply.

A first capacitance may be connected between the first node and a reference voltage supply and a second capacitance may be connected between the second node and the reference voltage supply. These capacitance may perform a noise filtering or smoothing function.

The comparator circuitry may comprise first and second gain-stage buffers each having a buffer input terminal and a buffer output terminal. The buffer input terminals may be connected to the first and second nodes, respectively. The first and second gain-stage buffers may be operable to output first and second buffer output signals at their respective buffer output terminals based on first and second buffer input signals received at their respective buffer input terminals from the respective first and second nodes, respectively.

The first and second gain-stage buffers may be CMOS inverters. The first and second gain-stage buffers may be non-clocked buffers. Such buffers may be advantageous in terms of overall noise performance as described later herein.

The comparator circuitry may comprise first and second controllable resistances, wherein the first controllable resistance is connected between the first node and a reference voltage supply and the second controllable resistance is connected between the second node and the reference voltage supply. The first and second controllable resistances may be configured to limit a voltage level change at the first and second nodes, respectively, during each capture operation.

The controllable resistances may be each connected to be controlled by a said buffer output signal. The controllable resistances may be each implemented as transistors.

The comparator circuitry may comprise differential-input dynamic or clocked latch circuitry, such as strongARM latch circuitry or buffered RS latch circuitry, the latch circuitry connected to receive its latch-input signals from the output nodes of the first and second gain-stage buffers, respectively, or from the first and second nodes, respectively, and to output one or more corresponding output signals being comparison-result output signals.

The comparator input signals may be voltage-mode signals and the magnitudes may be voltage levels. The comparator input signals may be current-mode signals and the magnitudes may be values of current. The comparator input signals may be charge-mode signals and the magnitudes may be amounts of charge. The comparator input signals may be analogue signals.

According to an embodiment of a second aspect of the present invention there is provided a comparator comprising the comparator circuitry of the aforementioned first aspect of the present invention.

According to an embodiment of a third aspect of the present invention there is provided comparison-result-dependent circuitry, comprising: the comparator circuitry of the aforementioned first aspect of the present invention; and control circuitry configured to control the bias current of the biasing current source based on the one or more comparison-result output signals or on one of both of signals generated at the first and second nodes.

Such comparison-result-dependent circuitry may be SAR ADC circuitry. The control circuitry may be configured to control the bias current of the biasing current source based on an error rate of a digital output generated in dependence upon the one or more comparison-result output signals, and/or based on how long the comparator circuitry takes to generate the one or more comparison-result output signals.

According to an embodiment of a fourth aspect of the present invention there is provided analogue-to-digital converter circuitry, comprising the comparator circuitry of of the aforementioned first aspect of the present invention or the comparator of the aforementioned second aspect of the present invention, or the comparison-result-dependent circuitry of the aforementioned third aspect of the present invention.

According to an embodiment of a fifth aspect of the present invention there is provided an IC chip, such as a flip chip, comprising the comparator circuitry of the aforementioned first aspect of the present invention, or the comparator of the aforementioned second aspect of the present invention, or the comparison-result-dependent circuitry of the aforementioned third aspect of the present invention, or the analogue-to-digital converter circuitry of the aforementioned fourth aspect of the present invention.

The present invention extends to method and computer program (e.g. control) aspects corresponding as appropriate to the apparatus (e.g. circuitry) aspects.

BRIEF DESCRIPTION OF THE FIGURES

Reference will now be made, by way of example to the accompanying drawings, of which.

DETAILED DESCRIPTION

Figure 5:
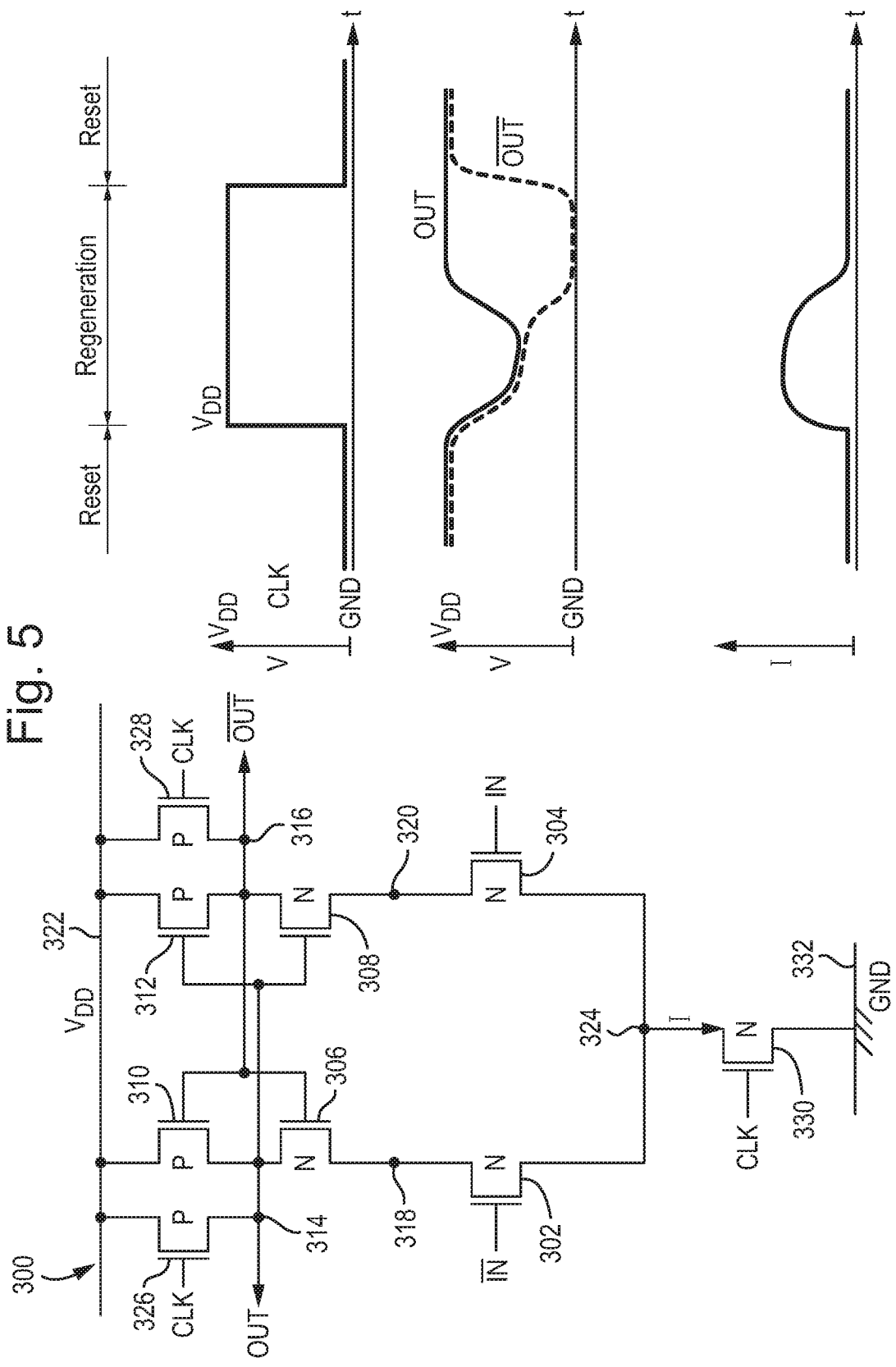
FIG. 5 is a schematic diagram of previously-considered example clocked comparator circuitry.

FIG. 5 is a schematic diagram of previously-considered example clocked comparator circuitry 300. Clocked comparator circuitry 300 may be referred to as latched comparator circuitry 300, and may be compared to latch circuitry known generically as a strongARM latch. The operation of the circuitry can be understood by the graphs provided and alongside and commented on in more detail below.

Circuitry 300 comprises a differential pair of input transistors 302 and 304, two cross-coupled pairs of transistors 306, 308, 310 and 312, output nodes 314 and 316, intermediate nodes 318, 320, a first reference voltage source 322, a tail node 324, clocked precharge transistors 326 and 328, a clocked "compare" transistor 330 and a second references voltage source 332, connected together as in FIG. 5.

More specifically, the differential pair of input transistors 302 and 304 are connected such that their gate terminals serve as a pair of differential inputs receiving input signals IN and /IN. These are the two comparator inputs to be compared to one another (see e.g. the two inputs to comparator 180 in FIG. 4).

The two cross-coupled pairs of transistors 306, 308, 310, 312 are coupled to form two cross-coupled inverters, with transistors 306 and 310 forming one of the inverters with its output connected to output node 314, and with transistors 308 and 312 forming the other one of the inverters with its output connected to output node 316. The inverter formed by transistors 306 and 310 is connected between the intermediate node 318 and the first reference voltage source 322, in this case VDD. The inverter formed by transistors 308 and 312 is connected between the intermediate node 320 and the first reference voltage source 322. The outputs of the inverters provide the outputs, at output nodes 314 and 316, of the comparator circuitry 300.

The differential pair of input transistors 302 and 304 are connected respectively between the intermediate node 318 and 320 and the common tail node 324.

The precharge (or reset) transistors 326 and 323 are respectively connected between the output nodes 314 and 316 and the first reference voltage source 322. The compare (or regeneration) transistor 330 is connected between the common tail node 324 and the second reference voltage source 332, in this case ground (GND). The precharge transistors 326 and 328 and the compare transistor 330 are connected to receive a clock signal CLK, in this case a switched logic level (e.g. square wave) signal alternating between logic high (VDD) and logic low (SND), as indicated in the relevant graph.

The transistors 302, 304, 306, 308 and 330 are NMOS MOSFETs, and the transistors 310, 312, 326 and 328 are PMOS MOSFETs.

In operation, the circuitry operates in alternating "reset" (where clock signal CLK is low) and "regeneration" (when clock signal CLK is high) phases in synchronisation with the clock signal CLK, as will be appreciated from the graphs in FIG. 5. Regeneration phases may be referred to as "compare" or, particularly in the light of circuitry disclosed later herein, as "capture" phases or operations.

In the "reset" phase when the clock signal CLK is low, the precharge transistors 326 and 328 are on and pull the output nodes 314 and 316 to logic high or VDD. At this time, the compare transistor 330 is off, preventing current from flowing through e.g. the intermediate nodes 318 and 320.

As soon as the clock signal CLK goes high for the regeneration phase, the precharge transistors 326 and 328 turn off and the compare transistor 330 turns on. Importantly, the input transistors 302 and 304 are also on to a differing degree if their input signals (the comparator inputs) are slightly different from one another, as they inevitably would be (if only slightly).

The voltage levels at output nodes 314 and 316 fail as the current begins to flow, but because the transistors 302 and 304 are inevitably on to differing degrees (in practice they will not be on to exactly the same degree) the differing currents flowing through the intermediate nodes 318 and 320 cause one of these voltages to drop (perhaps only slightly) faster than the other. The cross-coupled inverters serve to accelerate and amplify this difference (in the sense of increasing the difference, at an increasing rate) causing the voltage level at one of the output nodes to drop to logic low or ground (GND) and the voltage level at the other output node to rise again to logic high or VDD. This operation, and the associated flow of current through common tail node 324, can be appreciated from the graphs in FIG. 5.

Which of the output nodes 314 and 316 goes to logic high and which goes to logic low depends on (in the ideal case, in the absence of e.g. noise) which of the input signals IN and /IN is larger, so that the voltage levels of the output signals OUT and /OUT provide the comparison result at the end of that regeneration phase. The accuracy of the circuitry 300 is therefore dependent on the correct "decision" being taken when the voltage levels at the output nodes 314 and 316 diverge under acceleration of the cross-coupled inverters.

Of course, when the next "reset" phase starts when the clock signal CLK goes low, the precharge transistors 326 and 328 turn back on and the compare transistor 330 turns back off, stopping the flow of current (such that there is no static current) and precharging the output nodes 314 and 316 to logic high or VDD again.

It will therefore be appreciated that the clocked comparator circuitry 300 serves to perform a comparison operation per clock cycle, in particular during each regeneration phase when the clock signal CLK is high, the comparison operation comparing the voltage levels of the input signals IN and /IN at that time and giving output signals OUT and /OUT which are either logic high and logic low or vice versa depending (ideally) on which of the input signals IN and /IN has the higher voltage level.

As explained above, this action is dominated by the cross-coupled inverters in the upper half of the circuitry 300. Based on the difference between the input signals IN and /IN, one of the inverters will start pulling in a particular direction slightly quicker than the other because of the difference between the currents which initially flow through the transistors 302 and 304 at the input. This will cause the two inverters to accelerate/amplify the difference between the two sides, with their outputs rapidly diverging. Like CMOS inverter circuitry the supply current only flows while the circuitry is active.

Figure 6:
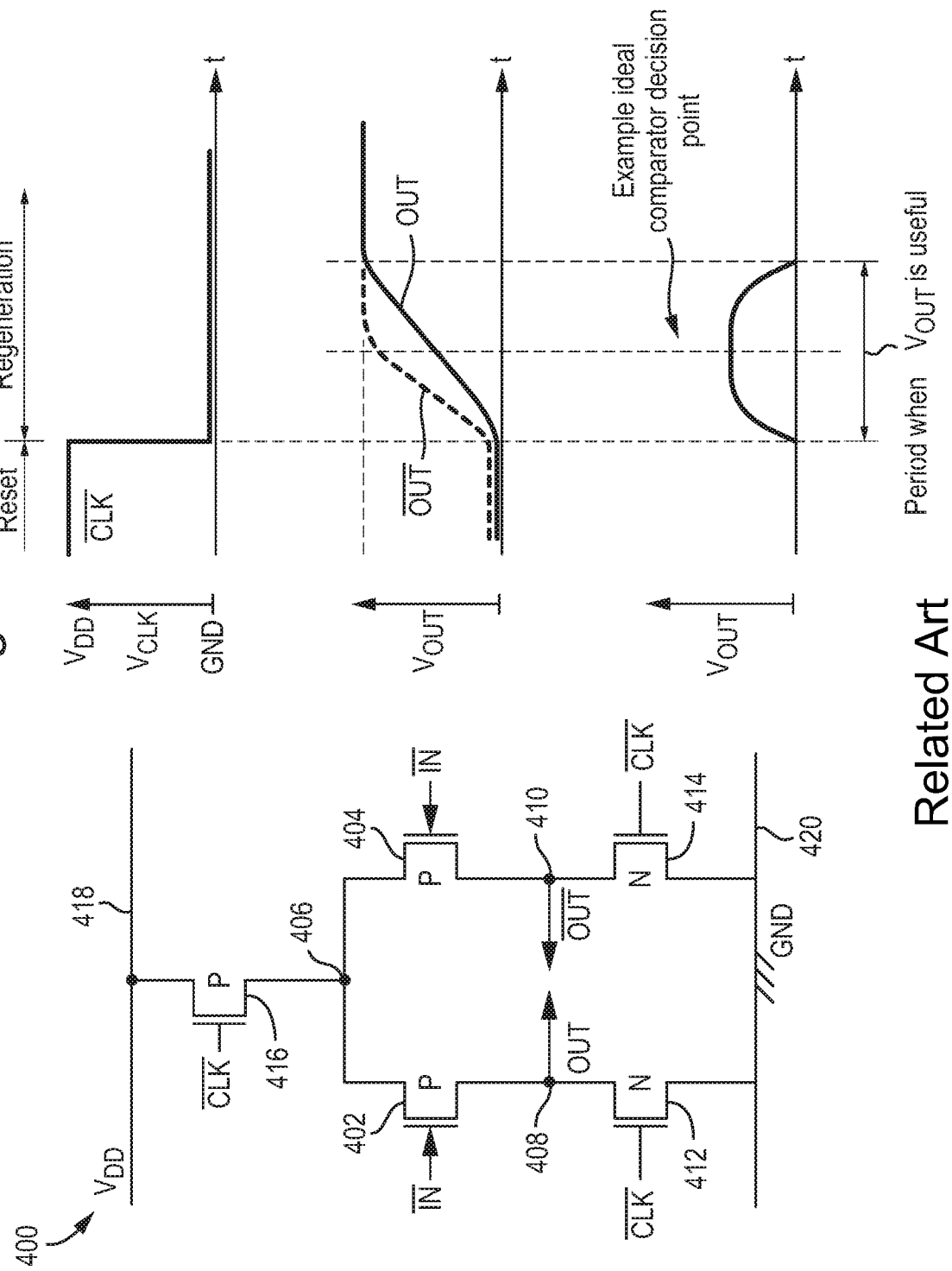
FIG. 6 schematic diagram of previously-considered example clocked pre-amplifier circuitry, for use with the FIG. 5 circuitry.

FIG. 6 is a schematic diagram of previously-considered example clocked pre-amplifier circuitry 400, for use with the clocked comparator circuitry 300. The operation of this circuitry 400 can be understood from the graphs provided alongside and commented on in more detail below, as for circuitry 300.

Circuitry 400 comprises a differential pair of input transistors 402 and 404, a common tail node 406, intermediate nodes 408 and 410, clocked transistors 412, 414 and 416, a first reference voltage source 418 and a second reference voltage source 420, connected together as in FIG. 6.

More specifically, the differential pair of input transistors 402 and 404 are connected such that their gate terminals serve as a pair of differential inputs receiving input signals IN and /IN. As before, these are the two comparator inputs to be compared with one another (see e.g. the two inputs to comparator 180 in FIG. 4). However, the clocked pre-amplifier circuitry 400 is for use with the clocked comparator circuitry 300 such that the output signals OUT and /OUT of the circuitry 400 (mentioned below) become the input signals IN and /IN in circuitry 300.

The input transistors 402 and 404 are connected between the common tail node 406 and the intermediate nodes 408 and 410, respectively. The clocked transistors 412 and 414 are respectively connected between the intermediate nodes 408 and 410 and the second reference voltage source 420, in this case ground (GND). The clocked transistor 416 is connected between the common tail node 406 and the first reference voltage source 418, in this case VDD. The ground and VDD levels between circuitry 300 and 400 may be the same but this is of course not essential.

The clocked transistors 412, 414 and 416 are connected to receive the clock signal /CLK, i.e. the inverse of the clock signal CLK in FIG. 5. Transistors 412 and 414 are NMOS MOSFETs and transistors 402, 404 and 416 are PMOS MOSFETs.

The intermediate nodes 408 and 410 provide the output signals OUT and /OUT to the transistors 304 and 302 in FIG. 5 as already mentioned.

In operation, the circuitry 400 operates based on the clock signal /CLK and thus for ease of comparison the "reset" and "regeneration" phases from FIG. 5 are shown for the graphs of FIG. 6.

In the "reset" phase, when the clock signal /CLK is high (and the clock signal CLK is low), the clocked transistors 412 and 414 are ON and the clocked transistor 416 is OFF. Thus, as with a CMOS inverter, the output signals OUT and /OUT at nodes 408 and 410 are at logic low or ground (GND). In the "regeneration" phase, when the clock signal /CLK is low, the clocked transistors 412 and 414 are OFF and the clocked transistor 416 is ON. Thus, again in line with a CMOS inverter, the output signals OUT and /OUT at nodes 408 and 410 both rise up to logic high or VDD, given sufficient time (which is assumed here for ease of understanding).

The voltage levels of the input signals IN and /IN control the degree to which transistors 402 and 404 are on, and during the regeneration phase this controls the current flowing through nodes 408 and 410 and consequently how quickly the voltage levels at those nodes rise up to logic high, i.e. up to the same voltage level. An example is shown in the $V_{OUT}$ graph in FIG. 6, with the output signal /OUT rising up to VDD quicker than the output signal OUT, and with there being a corresponding difference in voltage $\Delta V_{OUT}$ between these output signals OUT and /OUT for the short period of time indicated in the lower-most graph. An example ideal comparator decision point is indicated, i.e., where $V_{OUT}$ is largest, however it will be understood that the actual decision occurs under the operation of the circuitry 300 generally during the indicated period when $\Delta V_{OUT}$ is useful. It will be appreciated that the clocked pre-amplifier circuitry 400 can provide en amplified voltage difference $\Delta V_{OUT}$ at the input terminals (i.e. between input signals IN and /IN) of the circuitry 300 of FIG. 5, i.e. bigger than the voltage difference between the input signals IN and /IN of the circuitry 400 of FIG. 6 which would otherwise be provided directly to the circuitry 300 (i.e. in the absence of circuitry 400). This amplification provides some noise performance benefit, but the inventors have identified disadvantages.

Figure 7:
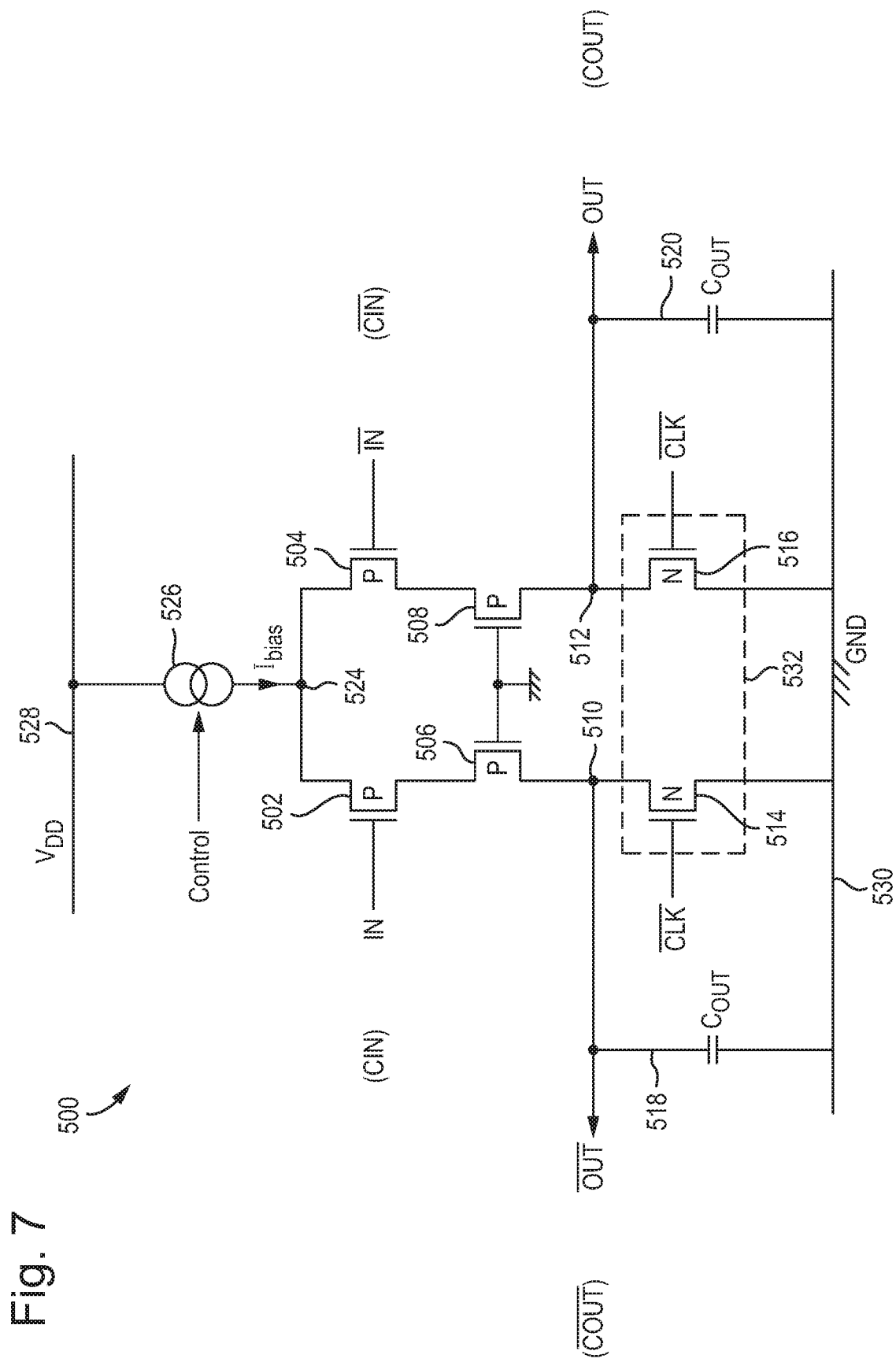
FIG. 7 is schematic diagram of a comparator first stage which may be or form part of comparator circuitry embodying the present invention.

These disadvantages will become apparent when the circuit 400 of FIG. 6 is compared with that in FIG. 7.

FIG. 7 is a schematic diagram of a comparator first stage 500 which may be or form part of comparator circuitry embodying the present invention.

The comparator first stage 500 is clocked circuitry and comprises a differential pair of input transistors 502 and 504, a pair of cascade transistors 506 and 508, a pair of output nodes 510 and 512, a pair of docked transistors 514 and 616, output capacitors 518 and 520, a tail node 524, a current source 526, a first reference voltage source (VDD) 528 and a second reference voltage source (GND) 530 connected together as shown in FIG. 7. More specifically, the differential pair of input transistors 502 and 504 are connected such that their gate terminals serve as a pair of differential inputs receiving input signals IN and /IN. As before, these are the two comparator inputs to be compare with one another (see e.g., the two inputs to comparator 180 in FIG. 4). However, the circuitry 500 is for example for use with the clocked comparator circuitry 690 of FIG. 9 discussed later (which is similar to the circuitry 300 of FIG. 5) such that output signals OUT and /OUT of the circuitry 500 (mentioned below) become, via other circuitry to be discussed in connection with FIG. 8, the input signals LIN and /LIN the circuitry 690 (which will be referred to as LIN and /LIN hereinafter).

The input transistors 502 and 504 are connected between the common tail node 524 and the output nodes 510 and 512, respectively, but via the cascade transistors 506 and 508, respectively. The transistors 506 and 508 are connected at their gate terminals to a steady, non-clocked or DC bias signal so that they act as cascade transistors. In this case, the transistors are PMOS transistors and their gate terminals are connected to the second voltage reference source (GND) 530. The clocked transistors 514 and 516 are respectively connected between the output nodes 510 and 512 and the second reference voltage source 530, in this case ground (GND). The current source 526 is connected between the common tail node 524 and the first reference voltage source 528, in this case VDD. The ground and VDD levels between circuitry 300 and 500 may be the same but this is again not essential.

The current source 526 is a non-clocked current source, configured to cause a steady or DC bias current $I_{bias}$ to flow into the tail node 524. The current source 526 is shown controlled by a control signal CONTROL, however this is not essential and the current source 526 could, without such a control signal, be configured to output a fixed bias current $I_{bias}$. In the case of the control signal CONTROL, the current source 526 could be configured to vary the magnitude of the bias current $I_{bias}$ dependent on the control signal CONTROL so as to effectively tune the operation of the circuitry 500. In that case, the current source 526 could be implemented as an IDAC (current DAC).

The output capacitors 518 and 520 are connected between the output nodes 510 and 512, respectively, and ground (GND). They could be provided as specific (discrete/separate) components or they could effectively be representative of the parasitic capacitance present at the output nodes 510 and 512, respectively.

The clocked transistors 514 and 516 are connected to receive same clock signal /CLK, i.e., the inverse of the clock signal CLK in FIG. 5. Transistors 514 and 516 are NMOS MOSFETs and transistors 502, 504, 506 and 508 are PMOS MOSFETs.

The output (or intermediate nodes 510 and 512) provide the output signals OUT and /OUT to circuitry of a second comparator stage 600 to be discussed later in connection with FIG. 8.

In operation, the circuitry 500 operates based on the clock signal /CLK and thus for ease of comparison the "reset" and "regeneration" phases from FIG. 5 can be considered to apply here too.

In the "reset" phase, when the clock signal /CLK is high (and the dock signal CLK is low), the docked transistors 514 and 516 are ON. Thus, the output signals OUT and /OUT at nodes 510 and 512 are pulled to logical low or ground (GND), discharging the output capacitors 518 and 520. In the "regeneration" phase, when the dock signal /CLK is low, the docked transistors 514 and 516 are OFF. Thus, the output signals OUT and /OUT at nodes 510 and 512 both rise up towards logic high or VDD, under the flow of the bias current in the two current paths, effectively charging up the output capacitors 518 and 520.

The voltage levels of the input signals IN and /IN control the degree to which transistors 502 and 504 are ON, and during the regeneration phase this controls the current flowing through output nodes 510 and 512 and consequently how quickly the voltage levels at those nodes rise up towards logic high. See, for example, the $V_{OUT}$ graph in FIG. 6, where the output signal /OUT rises up quicker than the output signal OUT, and with there being a corresponding difference in voltage $\Delta V_{OUT}$ between these output signals OUT and /OUT e.g., at the example ideal comparator decision point in time indicated in the lower-most graph. It will be appreciated that the docked circuitry 500 can provide an amplified voltage difference $\Delta V_{OUT}$ at the output nodes 510 and 512 (much like circuitry 400 does between nodes 408 and 410), i.e., bigger than the voltage difference between the input signals IN and /IN of the circuitry 500. This amplification provides some noise performance benefit as in FIG. 6, but there are also advantages over the circuitry 400 in FIG. 6.

These advantages (and thus also disadvantages associated with the circuitry 400 of FIG. 6) will now be explored.

In the circuitry 400 of FIG. 6, the intermediate nodes 408 and 410 (where the output signals OUT and /OUT are generated) are directly adjacent in terms of the current paths to the transistors 402 and 404 (at which the input signals IN and IN are received). Further, the clocked transistors 412, 414 and 416 are also adjacent in terms of the current paths to the transistors 402 and 404. Thus, in the circuitry 400 of FIG. 6, there can be the problem of relatively high input referred noise. Data dependent kickback noise as well as clock kickback noise limits the overall ADC effective number of bits (ENOB) resolution. A factor here is also the limited gain be n circuits 400 and 300, which will be addressed later in connection with FIG. 8.

In contrast, in the circuitry 500 of FIG. 7, there is no docked circuitry directly adjacent to the transistors 502 and 504 in terms of the current paths, at which the input signals IN and /IN are received. Specifically, the tail node 524, on one side of the transistors 502 and 504 in terms of the current paths, receives the steady (non-clocked) bias current $I_{bias}$ and the cascade transistors 506 and 508, on the other side of the transistors 502 and 504 in terms of the current paths, shield the transistors 502 and 504 both from the clocked transistors 514 and 516 and from any kickback effects related to circuitry connected with the nodes 510 and 512 (e.g., circuitry 300 via the circuitry of FIG. 8 to be discussed). Thus, this cascade-based first stage reduces data dependent kickback noise and together with the non-clocked bias current $I_{bias}$ reduces clock feedthrough to the input. Together with the FIG. 8 circuitry, there is very low thermal input referred noise, low kickback, and low clock feedthrough to the input. The circuitry is also relatively low power circuitry and is potentially digitally configurable by way of the optional IDAC serving as the current source 526 as mentioned above. Note also that the output capacitors 518 and 520 serve as low-pass filters for the noise.

Figure 8:
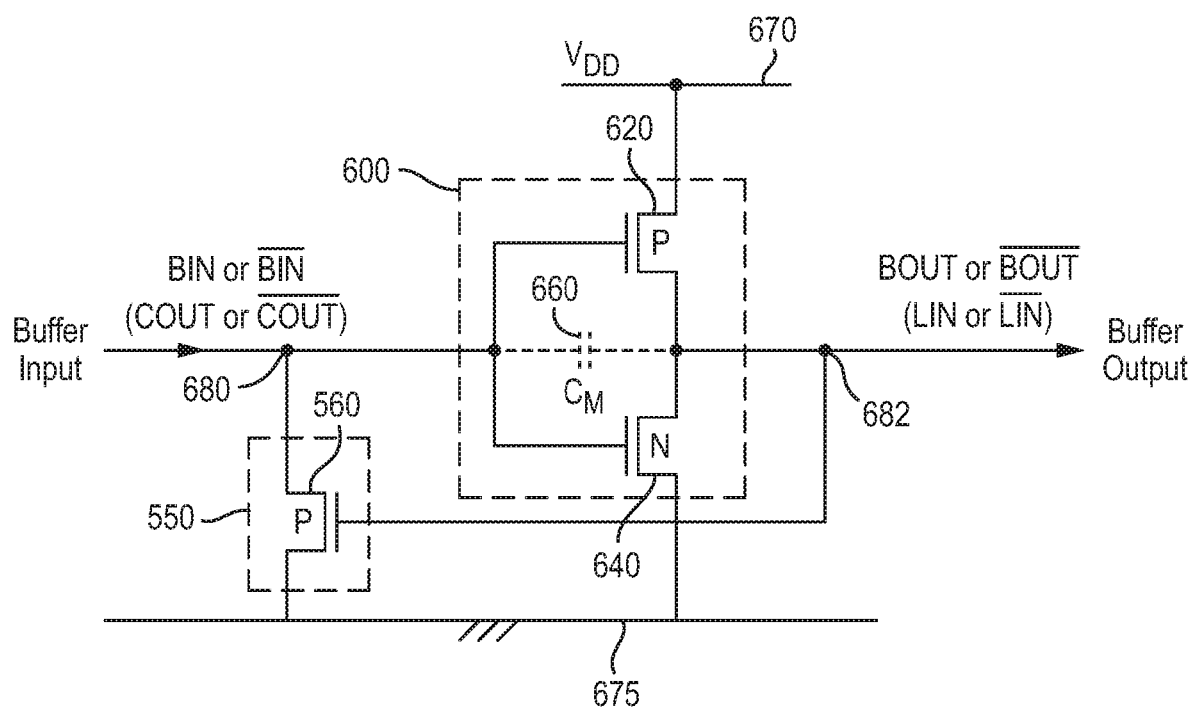
FIG. 8 presents a controllable resistance and gain-stage buffer circuitry, which together may be connected at each of the output nodes of the comparator first stage of FIG. 7 to serve as a comparator second stage.
Figure 9:
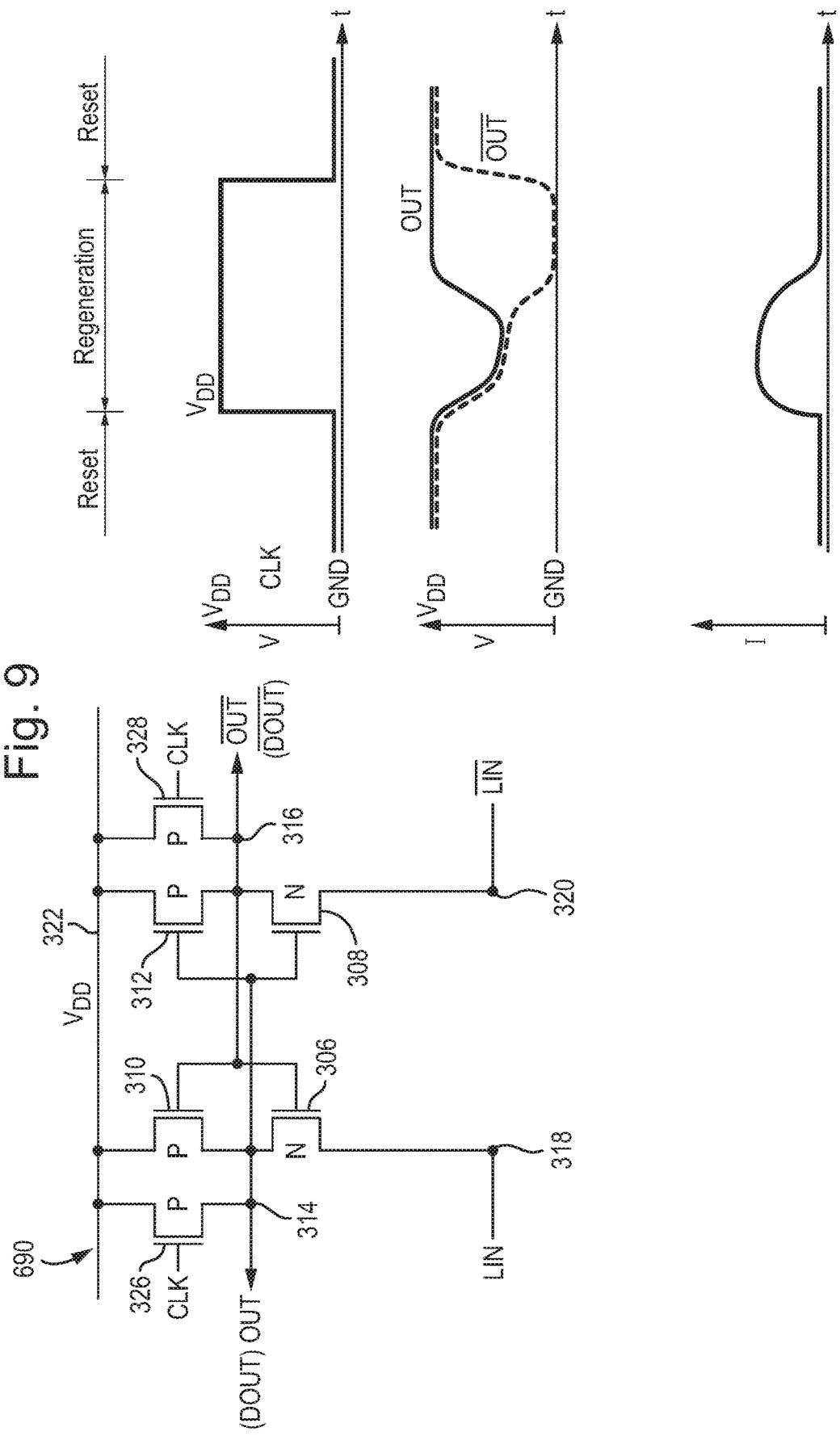
FIG. 9 is a schematic diagram of clocked comparator circuitry which may be used as a comparator third stage.
Figure 10:
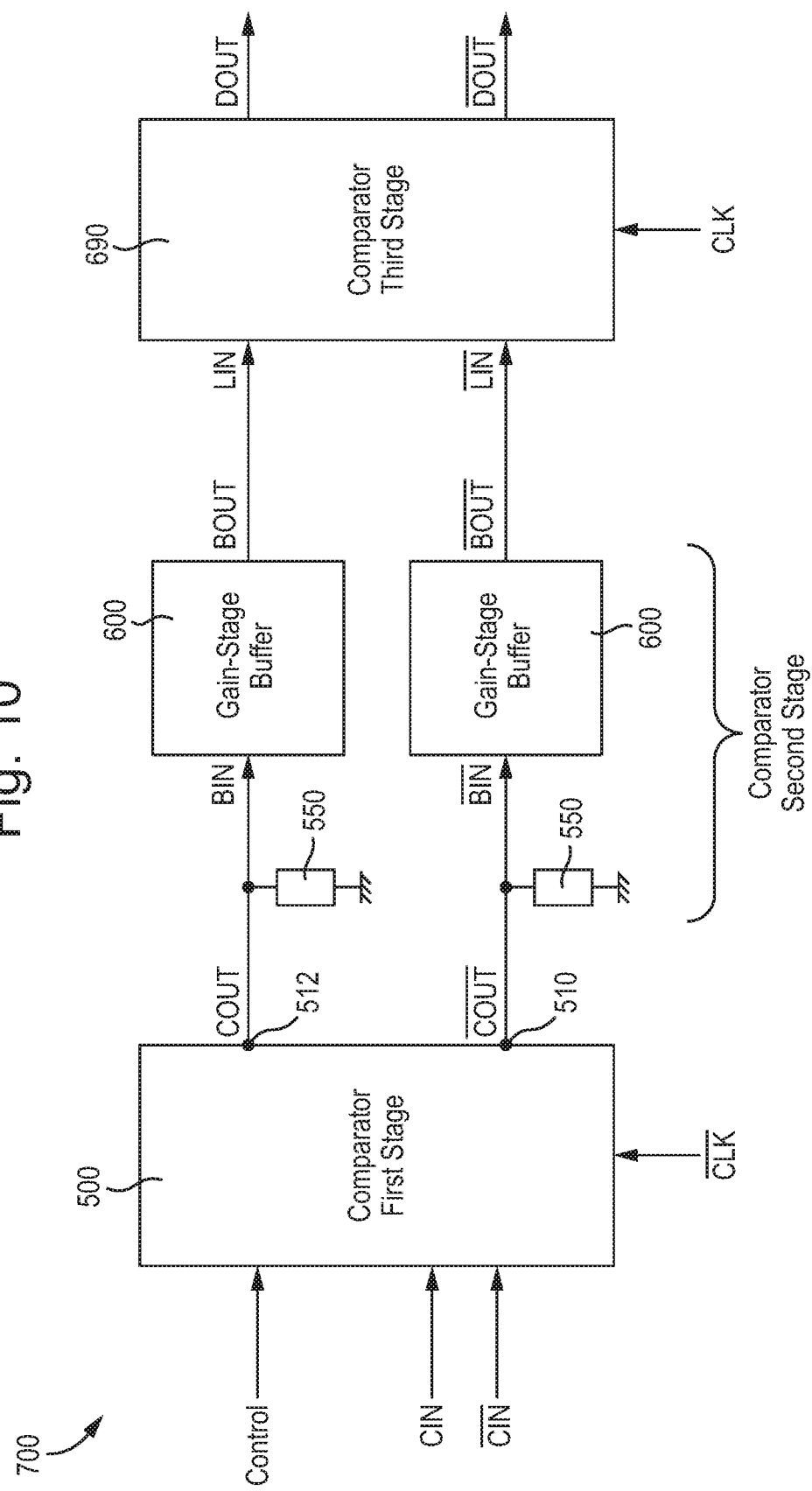
FIG. 10 is a schematic diagram of an overall comparator embodying the present invention.

Reference will now be made to FIGS. 8, 9 and 10.

FIG. 8 presents a controllable resistance 550 and gain-stage buffer circuitry 600, which together may be connected at each of the output nodes 510 and 512 of the comparator first stage 500 as a comparator second stage. FIG. 9 is a schematic diagram of clocked comparator circuitry 690 as a comparator third stage. FIG. 10 is a schematic diagram of an overall comparator 700 (which may be equated with the comparator 180 in FIG. 4), showing the comparator first stage 500 connected via the comparator second stage to the comparator third stage, which may be understood based on the clocked comparator circuitry 690 of FIG. 9.

Looking firstly at FIG. 9, it will be appreciated that the clocked comparator circuitry 690 is the same as the clocked comparator circuitry 300, except that the transistors 302, 304 and 330 have been omitted and the inputs LIN and /LIN are provided at nodes 318 and 320. Thus, the general operation in terms of the cross-coupled inverters (transistors 306, 308, 310, 312) and the clocked transistors 326, 328 will be understood from FIG. 5. How the inputs LIN and /LIN are obtained will become apparent.

Looking secondly at FIG. 10, to assist in tracking signals across the comparator 700, the input signals IN and /IN of the comparator first stage 500 are referred to as CIN and /CIN (comparator IN), respectively, and the output signals OUT and /OUT of the comparator first stage 500 are referred to as COUT and /COUT, respectively. These output signals COUT and /COUT become the input signals BIN and /BIN (buffer IN), respectively, of the respective sets of buffer circuitry 600. The corresponding output signals of the sets of buffer circuitry 600 are referred to as BOUT and /BOUT (buffer OUT), respectively, and these become the input signals LIN and /LIN (latch current IN) of the comparator third stage 690. The output signals OUT and /OUT of the comparator third stage 690 (corresponding to OUT and /OUT in FIG. 5) are then referred to as DOUT and /DOUT (digital or data OUT), respectively.

Returning then to FIG. 8, each set of buffer circuitry 600 is effectively a CMOS inverter, comprising a PMOS transistor 620 and an NMOS transistor 640 connected in an inverter arrangement between VDD 670 and GND 675 so that the inverter (buffer) input receives BIN or /BIN and outputs BOUT or /BOUT, respectively. The Miller capacitance $C_M$ 680 is explicitly shown (but is an effective capacitance rather than an added component): this contributes to the capacitance experienced at nodes 510 and 512 in FIG. 7 (i.e., in addition to the output capacitances 518 and 520).

Also shown in FIG. 8 is the controllable resistance 550, which is provided per set of buffer circuitry 600. Taking one of the sets of buffer circuitry 600 as an example, the controllable resistance 550 is connected between its input terminal 680 (effectively one of the nodes 510 and 512) and ground (GND) 675.

In this arrangement, controllable resistance is implemented as a PMOS transistor 560 whose gate terminal is connected to be controlled by the output signal BOUT or /BOUT at the output terminal 682 of the buffer circuitry 600. Thus, as the voltage level at the input terminal 680 rises in the regeneration phase (compare operation) of the comparator first stage 500, the voltage level at the output terminal 682 falls under the action of the inverter 600, causing the PMOS transistor 560 to turn on. This reduces the effective resistance of the controllable resistance 550 from infinity (i.e., when the transistor 560 is OFF) down to the ON resistance of the transistor 560 (i.e., when it ON). This has the effect of limiting how high the voltage level at the input terminal 680 can rise. Looking back to FIG. 7, this corresponds to limiting how high the voltage level at the output node 510 and 512 can rise, and thus ensures that the operation of the transistors 506 and 508 as cascode transistors is preserved, assisting with the kickback noise reduction discussed above. The controllable resistance 550 serves to prevent the comparator first stage 500 from entering saturation mode (specifically the cascode transistors 506 and 508) which would cause noise degradation. The controllable resistance 550 may be considered a non-linear resistive element.

The relatively high gain of the buffer stage 600 also helps to reduce the data dependent noise kickback from the comparator third stage 300 to the input signals CIN and /CIN.

As will be apparent from FIG. 10, the output signals BOUT and /BOUT of the two sets of buffer circuitry 600 are provided as the input signals LIN and LIN of the comparator third stage 690 as mentioned above. Looking at FIGS. 7, 8 and 9 together, when the clock signal CLK is low in the "reset" phase, transistors 326 and 328 are ON and the signals DOUT and /DOUT are held high. LIN and /LIN are also high with no current flowing as transistors 514 and 516 are also ON. When the clock signal CLK is high in the "regeneration" phase, transistors 326 and 328 are OFF and the signals DOUT and /DOUT drop from high initially and then are pulled in opposite directions under the action of the cross-coupled inverters as different currents flow at LIN and /LIN (based on a difference between CIN and /CIN) as the LIN and /LIN voltages begin to fall (transistors 514 and 516 are OFF). LIN and /LIN may be considered current inputs in this respect.

It is considered that the comparator first stage 500, taking into account the comparator second stage 550, 600, provides very low input referred noise (thermal and flicker) while providing a suitable compromise between layout area, input capacitance, speed and power consumption, also achieving very low data dependent kickback noise as well as clock kickback by means of using a non-clocked constant current bias. The speed, power and input noise can be adjusted by means of a programmable constant current bias ($I_{bias}$), for example by way of the control signal CONTROL and implementing the current source 526 as an IDAC as discussed above, providing independent behaviour regardless of input common mode voltage (e.g., attributable to a SAR capacitor array where the input signal of the overall SAR ADC is provided in this way).

Figure 1:
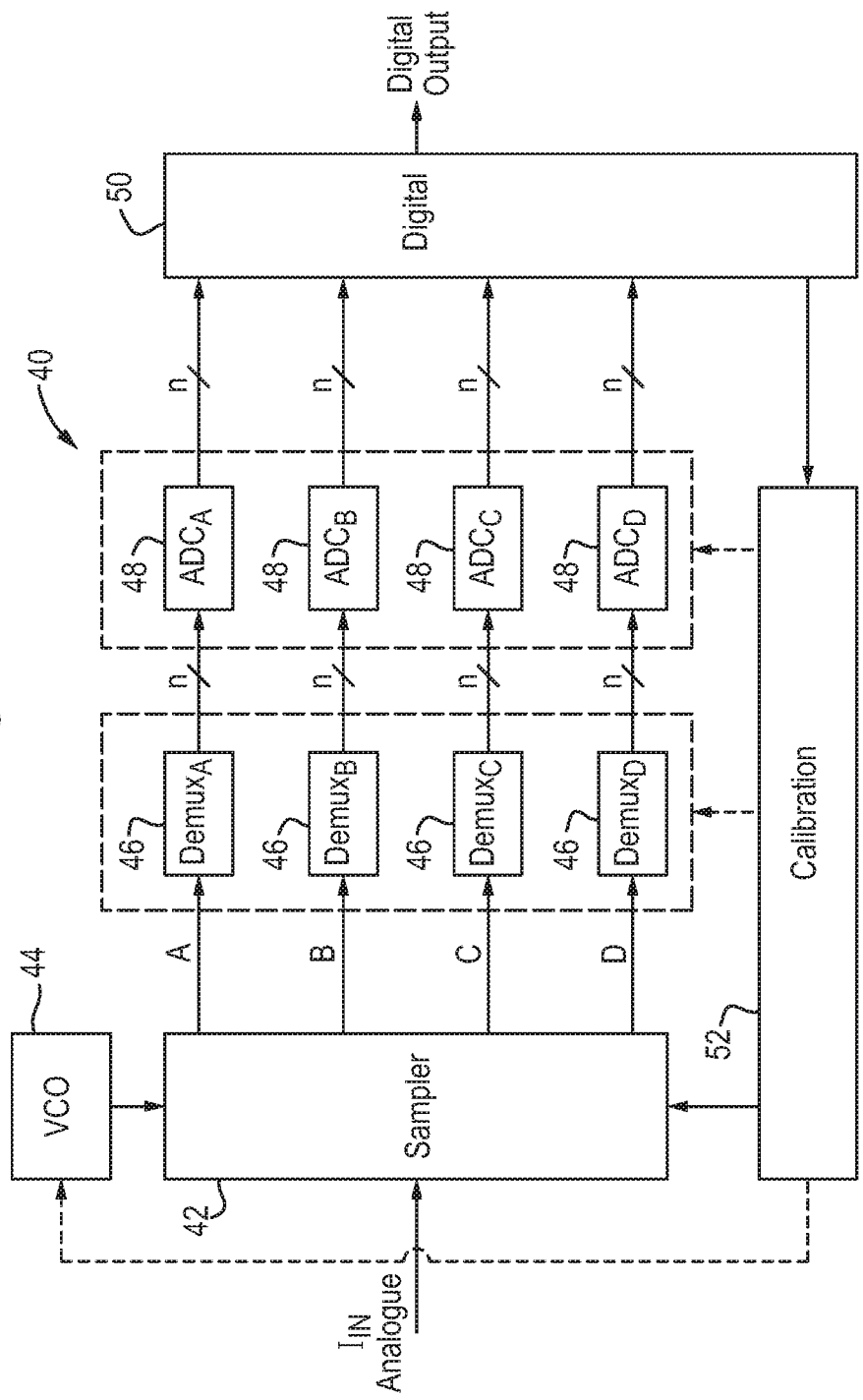
FIG. 1 considered above, is a schematic diagram of previously-considered analogue-to-digital circuitry.
Figure 2:
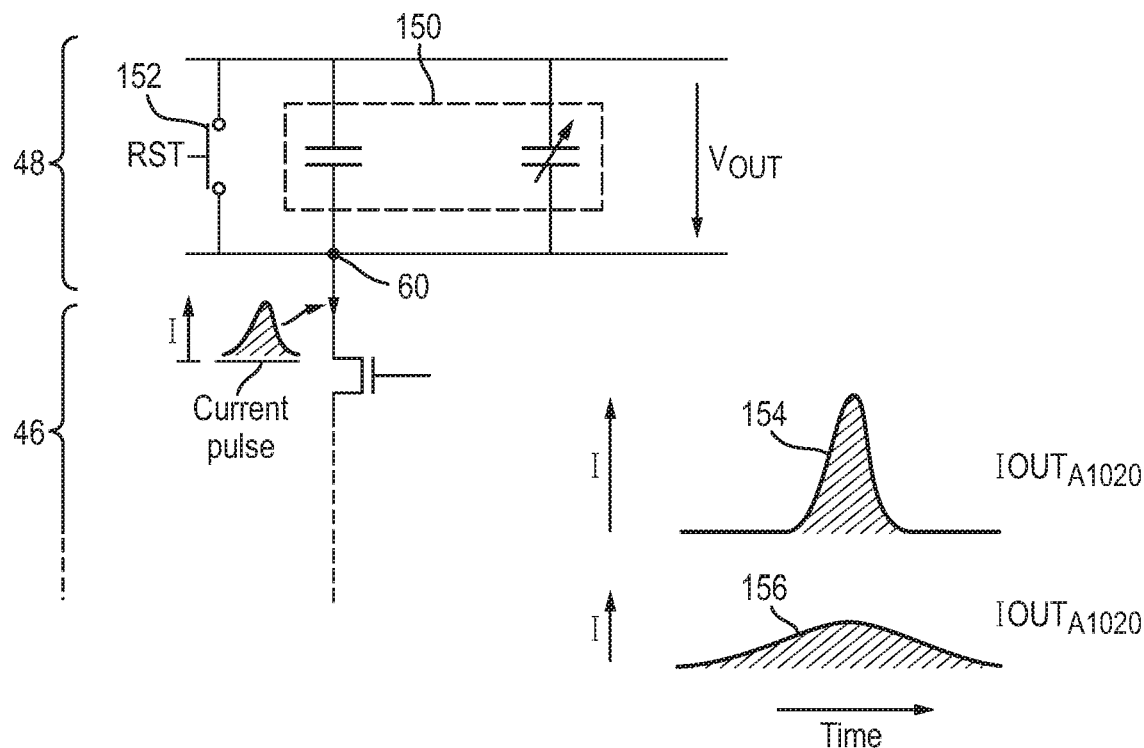
FIG. 2, considered above, is a schematic diagram useful for understanding the principle of operation of the ADC banks of FIG. 1.
Figure 3:
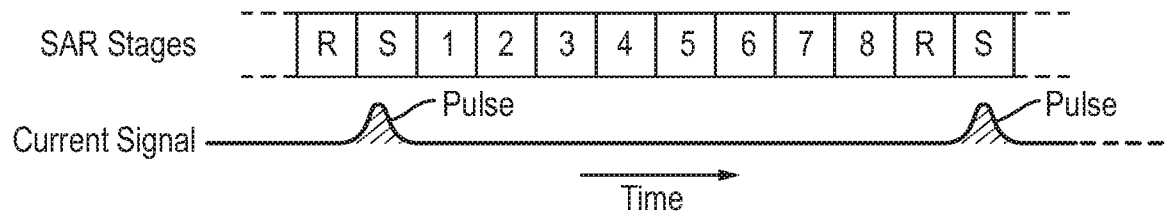
FIG. 3, considered above, is a schematic diagram useful for understanding a possible application of SAR-ADC circuitry within each sub-ADC unit of the FIG. 1 circuitry.
Figure 4:
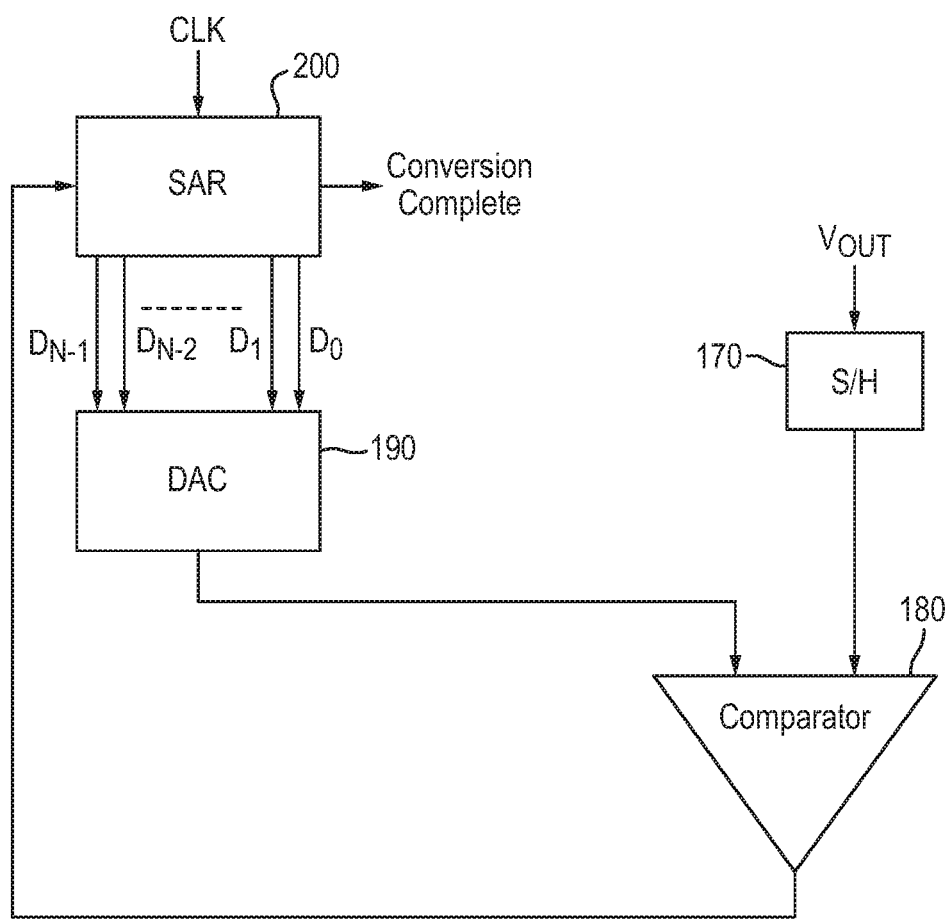
FIG. 4, considered above, presents example SAR ADC circuitry which may be employed with the circuitry of FIGS. 1 and 2.
Figure 11:
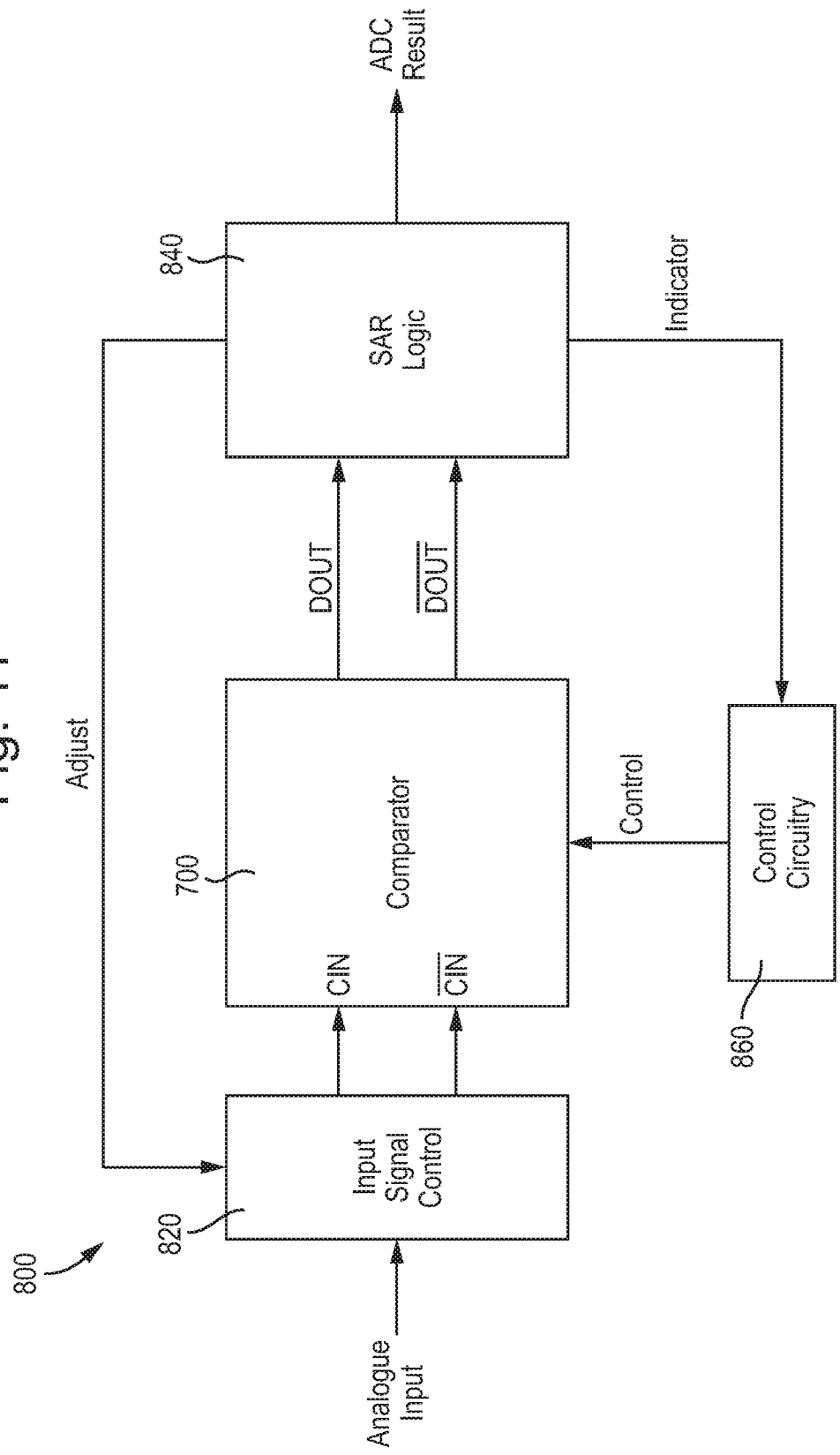
FIG. 11 is a schematic diagram of overall ADC circuitry embodying the present invention.

FIG. 11 is a schematic diagram useful for understanding how the control signal CONTROL may be produced and controlled, and is a schematic diagram of overall ADC circuitry 800 which may be equated with the circuitry of FIG. 4 for ease of understanding.

The ADC circuitry 800 comprises input signal control circuitry 820, the comparator 700, SAR logic circuitry 840 and control circuitry 860.

The input signal control circuitry 820 is configured to provide the input signals CIN and /CIN to the comparator 700 based on an analogue input signal and an ADJUST signal received from the SAR logic circuitry 840. The SAR logic circuitry 840 is configured to receive the output signals DOUT and /DOUT from the comparator 700 and generate the ADJUST signal to cause the input signal control circuitry 820 to adjust CIN and /CIN over a series of successive approximation operations until the SAR logic circuitry reaches an overall ADC result, e.g., an 8-bit digital output (data) value representative of the analogue input.

Thus, the comparator 700 may be equated with the comparator 180 in FIG. 4, the input signal control circuitry 820 may be equated with the DAC 190 in FIG. 4, and the SAR logic circuitry 840 may be equated with the SAR unit 200 in FIG. 4.

The SAR logic circuitry 840 is operable to monitor the overall analogue-to-digital conversion process, for example the symbol error rate and/or the time taken (e.g., relative to a clock signal such as a clock signal CLK mentioned earlier) to reach an ADC result or the time taken for each of the individual successive approximation operations to produce a DOUT and /DOUT output signal, i.e., reaching an end-of-conversion (EOC) state. Based on this, the SAR logic circuitry 840 generates an indicator signal INDICATOR which the control circuitry no uses to adjust the CONTROL signal and the value of $I_{bias}$. The value of $I_{bias}$ affects the performance of the comparator 700 and thus also of the entire ADC circuitry 800, and thus by controlling the value of $I_{bias}$ the performance can also be controlled. The circuitry 840 and/or 860 may be implemented in hardware and/or as a processor executing a computer program.

Figure 12:
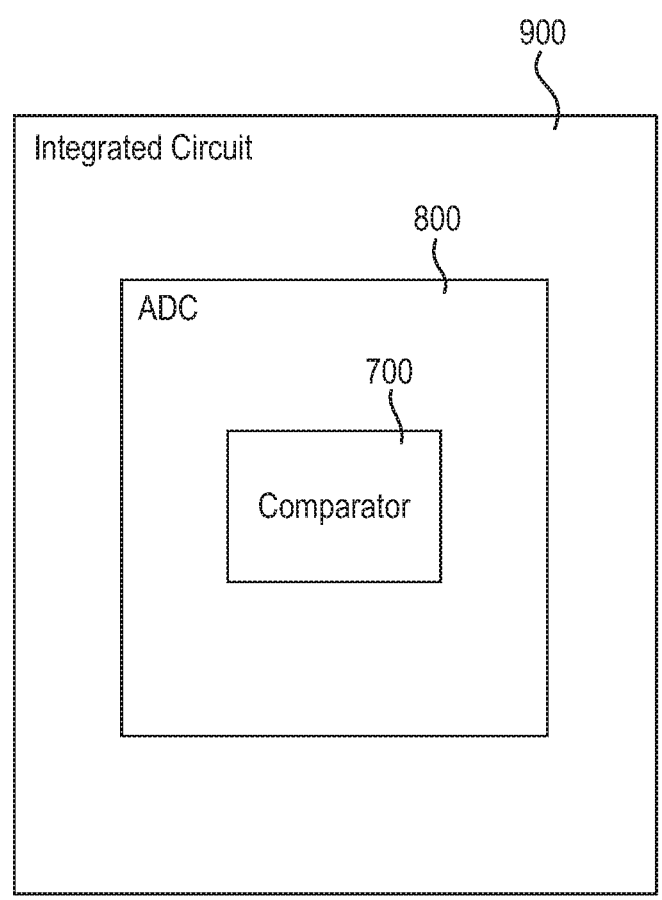
FIG. 12 is a schematic diagram of an integrated circuit embodying the present invention.

FIG. 12 is a schematic diagram of an integrated circuit 900 embodying the present invention. The integrated circuit 900 comprises the ADC circuitry 800, which itself comprises the comparator 700. It will be appreciated that the circuitry disclosed herein could be described as an ADC. Circuitry of the present invention may be implemented as integrated circuitry, for example on an IC chip such as flip chip. Thus, the integrated circuit 900 may be an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, the various method features may be implemented in hardware, or as software modules running on one or more processors. Features of one aspect may be applied to any of the other aspects. The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an internet website, or it could be in any other form.

In general, transistors disclosed herein may be implemented as MOSFETs or FETs (as shown) or as BJTs. The present disclosure will be understood accordingly.

The present invention may be embodied in many different ways in the light of the above disclosure, within the spirit and scope of the appended claims.

The invention claimed is:

1. Comparator circuitry for use in a comparator to capture differences between magnitudes of first and second comparator input signals in a series of capture operations defined by a clock signal, the circuitry comprising:
a biasing current source configured to provide a bias current which flows independently of the clock signal;
a tail node connected to receive the bias current;
first and second nodes conductively connectable to said tail node along respective first and second paths; and
switching circuitry configured during each capture operation to control connections between the tail node and the first and second nodes based on the first and second comparator input signals such that said bias current is divided between said first and second paths in dependence upon the difference between magnitudes of the first and second comparator input signals, wherein:

the switching circuitry comprises a first transistor whose channel forms part of the first path and a second transistor whose channel forms part of the second path;

gate or base terminals of the first and second transistors are controlled by the first and second comparator input signals, respectively, such that the conductivity of the connections between the tail node and the first and second nodes is controlled by the magnitudes of the first and second comparator input signals;

the switching circuitry further comprises a third transistor whose channel forms part of the first path and a fourth transistor whose channel forms part of the second path;

the third and fourth transistors are located along their respective paths between the first and second transistors and the first and second nodes, respectively;

the third and fourth transistors are non-clocked transistors whose gate or base terminals are controlled by a gate or base bias signal which is also independent of the clock signal;

the comparator circuitry further comprises first and second gain-stage buffers each having a buffer input terminal and a buffer output terminal;

the buffer input terminals are connected to the first and second nodes, respectively;

the first and second gain-stage buffers are operable to output first and second buffer output signals at their respective buffer output terminals based on first and second buffer input signals received at their respective buffer input terminals from the respective first and second nodes, respectively;

the comparator circuitry further comprises first and second controllable resistances;

the first controllable resistance is connected between the first node and a first reference voltage supply and the second controllable resistance is connected between the second node and the first reference voltage supply;

the first and second controllable resistances are configured to limit a voltage level change at the first and second nodes, respectively, during each capture operation; and the first and second controllable resistances are connected to be controlled by the first and second buffer output signals, respectively.

2. The comparator circuitry of claim 1, wherein:

the bias current is a non-clocked, constant or DC bias current; or the gate or base bias signal is a non-clocked, constant or DC bias signal.

3. The comparator circuitry of claim 1, wherein the gate or base bias signals of the third and fourth transistors are configured to cause the third and fourth transistors to function as cascode transistors.

4. The comparator circuitry of claim 1, wherein the switching circuitry comprises a clocked switch operable based on the clock signal to connect the first and second nodes to a second reference voltage supply between capture operations so as to bring a voltage level at those nodes to a pre-capture state.

5. The comparator circuitry of claim 4, wherein the clocked switch comprises a fifth transistor whose channel forms part of the first path and a sixth transistor whose channel forms part of the second path, wherein the fifth transistor is connected between the first node and the second reference voltage supply and the sixth transistor is connected between the second node and the second reference voltage supply.

6. The comparator circuitry of claim 1, comprising a first capacitance connected between the first node and a third reference voltage supply and a second capacitance connected between the second node and the third reference voltage supply.

7. The comparator circuitry of claim 1, wherein:

the first and second gain-stage buffers are CMOS inverters; or the first and second gain-stage buffers are non-clocked buffers.

8. The comparator circuitry of claim 1, wherein the controllable resistances are each implemented as transistors.

9. The comparator circuitry of claim 1, comprising differential-input dynamic or clocked latch circuitry, the differential-input dynamic or clocked latch circuitry connected to receive its latch-input signals from the buffer output terminals of the first and second gain-stage buffers, respectively, or from the first and second nodes, respectively, and to output one or more corresponding output signals being comparison-result output signals.

10. The comparator circuitry of claim 1, wherein:

the comparator input signals are voltage-mode signals and the magnitudes are voltage levels; or the comparator input signals are current-mode signals and the magnitudes are values of current, or the comparator input signals are charge-mode signals and the magnitudes are amounts of charge; or the comparator input signals are analogue signals.

11. The comparator comprising the comparator circuitry of claim 1.

12. Comparison-result-dependent circuitry, comprising:

the comparator circuitry of claim 1; and control circuitry configured to control the bias current of the biasing current source based on one or both of the first and second buffer input signals.

* * * * *